United States Patent
Lee et al.

(10) Patent No.: US 11,796,873 B2
(45) Date of Patent: Oct. 24, 2023

(54) DISPLAY DEVICE

(71) Applicant: Samsung Display Co., Ltd., Yongin-Si (KR)

(72) Inventors: Yong Hee Lee, Suwon-si (KR); Dong Hee Shin, Asan-si (KR); Geun Ho Lee, Hwaseong-si (KR)

(73) Assignee: Samsung Display Co., Ltd., Yong-si (KR)

( * ) Notice: Subject to any disclaimer, the term of this patent is extended or adjusted under 35 U.S.C. 154(b) by 0 days.

(21) Appl. No.: 17/128,253

(22) Filed: Dec. 21, 2020

(65) Prior Publication Data

US 2021/0333663 A1 Oct. 28, 2021

(30) Foreign Application Priority Data

Apr. 28, 2020 (KR) .................. 10-2020-0051356

(51) Int. Cl.
  *G02F 1/1368* (2006.01)
  *G02F 1/1362* (2006.01)
  *H01L 27/12* (2006.01)
  *G02F 1/1339* (2006.01)
  *G02F 1/1343* (2006.01)

(52) U.S. Cl.
  CPC ...... *G02F 1/136209* (2013.01); *G02F 1/1368* (2013.01); *G02F 1/13394* (2013.01); *G02F 1/134309* (2013.01); *G02F 1/136222* (2021.01); *G02F 1/136286* (2013.01); *H01L 27/1244* (2013.01); *H01L 27/1248* (2013.01); *H01L 27/1255* (2013.01)

(58) Field of Classification Search
  CPC .......... G02F 1/136209; G02F 1/13394; G02F 1/134309; G02F 1/136222; G02F 1/136286; G02F 1/1368; H01L 27/1244; H01L 27/1248; H01L 27/1255
  See application file for complete search history.

(56) References Cited

U.S. PATENT DOCUMENTS

2017/0256653 A1* 9/2017 Wang .................... H01L 27/124

FOREIGN PATENT DOCUMENTS

| KR | 10-2004-0084480 A | 10/2004 |
| KR | 10-1675372 B1 | 11/2016 |
| KR | 10-2017-0125176 A | 11/2017 |
| KR | 10-2018-0052805 A | 5/2018 |
| KR | 10-2019-0090410 A | 8/2019 |

* cited by examiner

*Primary Examiner* — James A Dudek
(74) *Attorney, Agent, or Firm* — Innovation Counsel LLP

(57) ABSTRACT

A display device according to an exemplary embodiment of the present inventive concept includes: a first substrate; a gate line extending parallel to a first direction; a storage electrode line disposed on the same layer as the gate line; a data line insulated from the gate line and the storage electrode line and extending parallel to a second direction perpendicular to the first direction; a drain electrode disposed on the same layer as the data line and including an expansion; a first electrode electrically connected to the drain electrode; a spacer disposed on the first electrode; a second substrate overlapping the first substrate; and a light blocking layer disposed on the second substrate and having an opening exposing the first electrode, a separation distance of the expansion of the drain electrode and the data line along the first direction is 1 μm to 10 μm.

14 Claims, 10 Drawing Sheets

DISPLAY DEVICE

CROSS-REFERENCE TO RELATED APPLICATION

This application claims priority to and the benefit of Korean Patent Application No. 10-2020-0051356 filed in the Korean Intellectual Property Office on Apr. 28, 2020, the entire contents of which are incorporated herein by reference.

BACKGROUND

(a) Technical Field

The present disclosure relates to a display device, and in detail, to a display device for preventing light leakage.

(b) Description of the Related Art

A liquid crystal display is one of currently widely used display devices. The liquid crystal display controls an amount of transmitted light by applying a voltage to electrodes (a pixel electrode and a common electrode) formed on two substrates facing each other to control an arrangement of liquid crystals in a liquid crystal layer interposed therebetween.

This liquid crystal display includes a thin film transistor connected to electrodes. The thin film transistor is used as a switching element that drives each pixel independently in the liquid crystal display.

In detail, the thin film transistor is a switching element controlling a data signal to be provided to the pixel electrode through the data line in response to the gate signal provided through the gate line in each pixel, and includes a gate electrode connected to the gate line, a semiconductor layer disposed on the gate electrode and forming a channel, a source electrode disposed on the semiconductor layer and connected to the data line, and a drain electrode spaced apart from the source electrode with the semiconductor layer interposed between the source electrode and the drain electrode.

As a display device that may be bent has recently been used, a misalignment between two substrates of the display device may occur during the bending process.

The above information disclosed in this Background section is only for enhancement of understanding of the background of the inventive concept, and therefore it may contain information that does not form the prior art that is already known in this country to a person of ordinary skill in the art.

SUMMARY

Exemplary embodiments are to provide a display device for preventing light leakage by misalignment of the upper and lower substrates.

A display device according to an exemplary embodiment of the present inventive concept includes: a first substrate; a gate line disposed on the first substrate and extending parallel to a first direction; a storage electrode line disposed on the same layer as the gate line; a data line insulated from the gate line and the storage electrode line and extending parallel to a second direction perpendicular to the first direction; a drain electrode disposed on the same layer as the data line and including an expansion; a first electrode electrically connected to the drain electrode; a spacer disposed on the first electrode; a second substrate overlapping the first substrate; and a light blocking layer disposed on the second substrate and having an opening exposing the first electrode, wherein a separation distance of the expansion of the drain electrode and the data line along the first direction is 1 μm to 10 μm.

The length of the extension of the drain electrode along the first direction may be longer than the length along the second direction.

The storage electrode line may include a transverse portion disposed parallel to the first direction and an expansion protruded from the transverse portion along the second direction, and the extension of the storage electrode line may be completely covered by the extension of the drain electrode.

The planar area of the extension of the storage electrode line may be smaller than the planar area of the extension of the drain electrode.

The length of the spacer along the first direction may be longer than the length of the extension of the drain electrode along the first direction.

The difference of the width of the first electrode along the first direction and the width of the spacer along the first direction may be 20% or less.

The distance between one edge of the light blocking layer extending parallel to the first direction and one edge of the spacer extending parallel to the first direction may be 5 μm to 10 μm.

The distance between one edge of the light blocking layer extending parallel to the first direction and one edge of the extension of the drain electrode extending parallel to the first direction may be 10 μm or less.

One edge of the extension of the drain electrode extending parallel to the first direction may be disposed closer to the opening of the light blocking layer than one edge of the spacer extending along the first direction.

A color filter disposed between the drain electrode and the first electrode may be further included, the color filter may include an opening overlapping the drain electrode, and the spacer may be disposed to overlap the opening in a plan view.

The first electrode may include: a stem portion extending parallel to the second direction; a minute branch portion extending from the stem portion; and a protruded portion connected to the drain electrode. The protruded portion and the stem portion may be spaced apart each other.

The gate line may include: a first gate line and a second gate line extending parallel to the first direction; and a gate electrode connecting the first gate line and the second gate line, and the spacer may overlap the gate electrode in a plan view.

A display device according to another exemplary embodiment of the present inventive concept includes: a first substrate; a gate line disposed on the first substrate and extending parallel to the first direction; a storage electrode line disposed on the same layer as the gate line; a data line insulated from the gate line and the storage electrode line and extending parallel to second direction perpendicular to the first direction; a drain electrode disposed on the same layer as the data line and including an extension; a first electrode electrically connected to the drain electrode; a spacer disposed on the first electrode; a second substrate overlapping the first substrate; and a light blocking layer disposed on the second substrate and having an opening exposing the first electrode, wherein the extension of the drain electrode includes a first region and a second region, the length of the first region along the first direction is shorter than the length of the second region along the first direction, and the second region is closer to the opening of the light blocking layer than the first region.

The separation distance of the first region of the extension of the drain electrode and the data line in the first direction may be 1 μm to 10 μm.

A length of the spacer along the first direction may be longer than a length of the extension of the drain electrode along the first direction.

The storage electrode line may include a transverse portion extending parallel to the first direction and an extension protruded from the transverse portion a length of the spacer along the first direction is longer than a length of the extension of the drain electrode along the first direction the second direction, and the transverse portion of the storage electrode line may overlap the first region of the extension of the drain electrode in a plan view.

The entire extension of the storage electrode line may be covered by the extension of the drain electrode.

A display device according to another exemplary embodiment of the present inventive concept includes: a first substrate; a gate line disposed on the first substrate and extending parallel to a first direction; a storage electrode line disposed on the same layer as the gate line; a data line insulated from the gate line and the storage electrode line and extending parallel to a second direction perpendicular to the first direction; a drain electrode disposed on the same layer as the data line and including an extension; a first electrode electrically connected to the drain electrode; a spacer disposed on the first electrode; a second substrate overlapping the first substrate; and a light blocking layer disposed on the second substrate and having an opening exposing the first electrode, wherein the extension of the drain electrode includes a first edge and a second edge parallel to the first direction, the first edge is disposed closer to the opening of the light blocking layer than the second edge, and the length of the first edge along the first direction is longer than the length of the second edge along the first direction.

The planar shape of the extension of the drain electrode may be trapezoidal.

The storage electrode line may include a transverse portion extending parallel to the first direction and an extension protruded from the transverse portion along the second direction, and the transverse portion of the storage electrode line is disposed closer to the second edge than the first edge of the extension of the drain electrode.

The separation distance of the second edge of the extension of the drain electrode and the data line along the first direction may be 1 μm to 10 μm.

According to exemplary embodiments, the display device capable of preventing light leakage during the upper/lower substrate misalignment is provided.

DETAILED DESCRIPTION OF THE EMBODIMENTS

Figure 1:
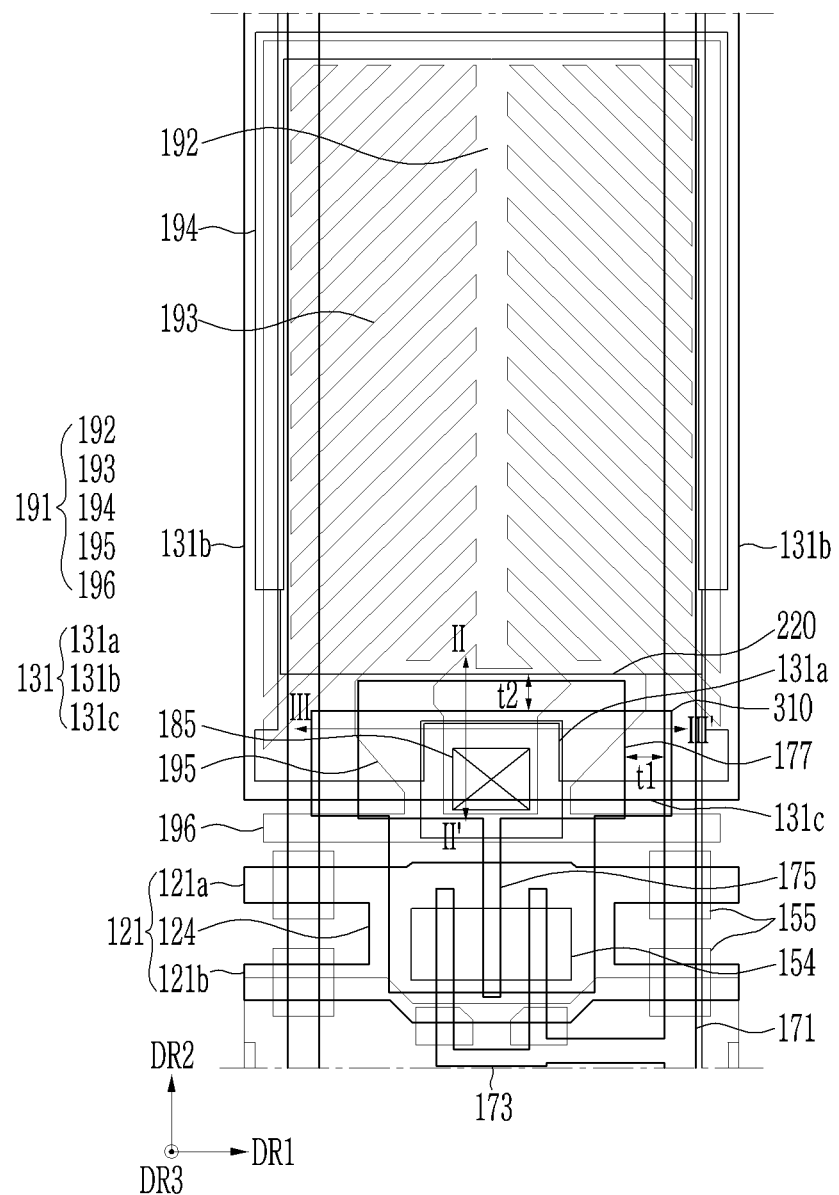
FIG. 1 is a layout view of a display device according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

In order to clearly explain the present inventive concept, portions that are not directly related to the present inventive concept are omitted, and the same reference numerals are attached to the same or similar constituent elements through the entire specification.

In addition, the size and thickness of each configuration shown in the drawings are arbitrarily shown for better understanding and ease of description, but the present inventive concept is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising" will be understood to imply the inclusion of stated elements but not the exclusion of any other elements.

In addition, in the specification, when referring to "connected to", this does not mean only that two or more constituent elements are directly connected to each other, but two or more constituent elements may be indirectly connected, physically connected and electrically connected through other constituent elements, and it may be included that each part that is substantially integral is connected to each other although referred to as different names depending on the position or function.

Further, throughout the specification, the phrase "on a plane" means viewing a target portion from the top, and the phrase "on a cross-section" means viewing a cross-section formed by vertically cutting a target portion from the side.

Figure 2:
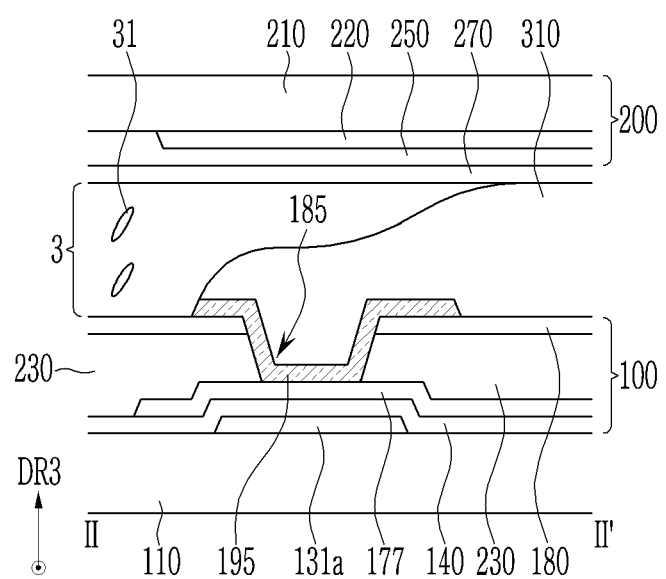
FIG. 2 is a cross-sectional view taken along a line II-IT of FIG. 1.

FIG. 1 is a layout view of a display device according to an exemplary embodiment of the present inventive concept. FIG. 2 is a cross-sectional view taken along a line II-II' of FIG. 1.

Figure 3:
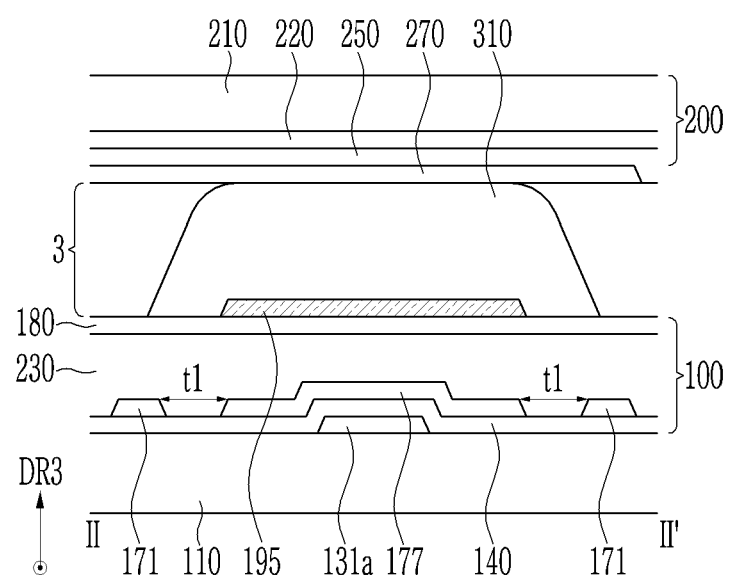
FIG. 3 is a cross-sectional view taken along a line III-III' of FIG. 1.

FIG. 3 is a cross-sectional view taken along a line III-III' of FIG. 1. Now, a display device according to an exemplary embodiment of the present inventive concept is described in detail with reference to FIG. 1 to FIG. 3.

Referring to FIG. 1 to FIG. 3, the display device which include pixels according to an exemplary embodiment includes a first display panel 100 and a second display panel 200 facing each other, and a liquid crystal layer 3 interposed therebetween.

First, the first display panel 100 is described. Referring to FIG. 1 to FIG. 3, the first display panel 100 includes a gate line 121 disposed on a first substrate 110 made of transparent glass or plastic.

The gate line 121 transmits a gate signal and extends in a first direction DR1. The gate line 121 may include a first gate line 121a and a second gate line 121b parallel to each other. A gate electrode 124 may be disposed between the first gate line 121a and the second gate line 121b, and the first gate line 121a and the second gate line 121b may be connected by the gate electrode 124. A semiconductor layer 154, a source electrode 173, and a drain electrode 175 may be disposed on the gate electrode 124 to form a transistor.

Simultaneously referring to FIG. 1 to FIG. 3, a storage electrode line 131 is disposed on the same layer as the gate line 121. The storage electrode line 131 may be formed by the same process as the gate line 121 and may include the same material.

The storage electrode line 131 may include longitudinal portions 131b extending parallel to a second direction DR2 and transverse portions 131c extending parallel to the first direction DR1. Two longitudinal portions 131b disposed on both edges of a first electrode 191 may be connected by the transverse portion 131c.

A portion of the transverse portion 131c is protruded in the second direction DR2 toward the first electrode 191 to form a protruded portion 131a. It is separately described later, but the protruded portion 131a of the storage electrode line 131 may overlap an extension 177 of the drain electrode 175 in a third direction DR3, thereby forming a capacitor. It is separately described later, but the planar area of the protruded portion 131a of the storage electrode line 131 may be smaller than the planar area of the extension 177 of the drain electrode 175, and the entire protruded portion 131a of the storage electrode line 131 may be overlapped with the extension 177 of the drain electrode 175 in the third direction DR3. Therefore, even when a misalignment of the protruded portion 131a of the storage electrode line 131 during the manufacturing process of the display device is occurred, since the entire protruded portion 131a of the storage electrode line 131 is overlapped with the extension 177 of the drain electrode 175, the extension 177 of the drain electrode 175 completely covers the protruded portion 131a of the storage electrode line 131, and the capacitor may be stably maintained.

Referring to FIG. 1 to FIG. 3, a gate insulating layer 140 is disposed on the gate line 121 and the storage electrode line 131. The gate insulating layer 140 may include a silicon oxide or a silicon nitride. The gate insulating layer 140 may have a multilayer structure including at least two insulating layers having different physical properties.

The semiconductor layer 154 is disposed on the gate insulating layer 140. The semiconductor layer 154 may be disposed to overlap the gate electrode 124. Referring to FIG. 1, a plurality of semiconductor patterns 155 may be disposed on the same layer as the semiconductor layer 154. A plurality of semiconductor patterns 155 may be disposed at positions where the gate line 121 and a data line 171 cross each other. A short-circuit between the gate line 121 and the data line 171 may occur due to conductive particles in the region where the data line 171 crosses the gate line 121. When the semiconductor pattern 155 is disposed in the crossing region, the possibility of a short-circuit may be reduced.

The data line 171 is disposed along the second direction DR2. The data line 171 transmits a data signal and extends in the second direction DR2, thereby crossing the gate line 121. The source electrode 173 extends from the data line 171, overlaps the semiconductor layer 154 and the gate electrode 124, and may have an approximate U-shape.

The drain electrode 175 is spaced apart from the data line 171 and extends upward from the center of the U shape of the source electrode 173. The drain electrode 175 may include an extension 177 connected to the first electrode 191. The extension 177 of the drain electrode overlaps the storage electrode line 131. Particularly, the extension 177 may be disposed to completely overlap the protruded portion 131a of the storage electrode line 131 among the storage electrode line 131.

One gate electrode 124, one source electrode 173, and one drain electrode 175 form one transistor along with the semiconductor layer 154, and the channel region of the transistor is formed in the semiconductor layer 154 between the source electrode 173 and the drain electrode 175.

Referring to FIG. 1, the length of the extension 177 of the drain electrode in the first direction DR1 may be longer than the length in the second direction DR2. Also, the extension 177 of the drain electrode has a larger planar area than the protruded portion 131a of the storage electrode line 131, and the entire protruded portion 131a of the storage electrode line 131 may be disposed to overlap the extension 177 of the drain electrode 175.

The length of the extension 177 of the drain electrode 175 in the first direction DR1 may be similar to or smaller than the distance between two data lines 171 disposed at both sides of the extension 177 of the drain electrode 175 in the first direction DR1. That is, the extension 177 of the drain electrode 175 may be disposed to be separated from the data line 171 in the first direction DR1.

Referring to FIG. 1 and FIG. 3, a separation distance t1 in this case may be 1 μm to 10 μm. This separation distance is intended to secure a space for repair when the short-circuit between the storage electrode line 131 and the data line 171 during the manufacturing process occurs. That is, when the short-circuit between the storage electrode line 131 and the data line 171 occurs, the storage electrode line 131 between the data line 171 and the extension 177 of the drain electrode 175 may be cut off to be repaired.

As shown in FIG. 1 to FIG. 3, the extension 177 of the drain electrode 175 is disposed to cover most of the region in the first direction DR1 between two neighboring data lines 171. Since the extension 177 of the drain electrode 175 is widely disposed as above-described in the first direction DR1, the extension 177 of the drain electrode forms a large area of a light blocking portion in the first direction DR1 and prevents light leakage even when a misalignment between the upper substrate and the lower substrate occurs.

Referring to FIG. 1, one edge of the extension 177 of the drain electrode 175 which extends parallel to the first direction DR1 may be disposed to be adjacent to one edge of a light blocking layer 220. The one edge of the extension 177 of the drain electrode 175 which extends parallel to the first direction DR1 may be disposed to be coincide with the one edge of the light blocking layer 220 in a plan view.

In this specification, the meaning of the adjacent to one edge of the light blocking layer means that the distance between the one edge of the light blocking layer and the one edge of the extension 177 of the drain electrode is 10 μm or less. That is, when considering a misalignment that may occur in the process, if the distance between the one edge of the extension 177 of the drain electrode and the one edge of the light blocking layer 220 is 10 μm or less, it may be considered to be disposed adjacently.

Therefore, even if the position of the opening of the light blocking layer 220 is changed due to the misalignment between the upper substrate and the lower substrate, the extension 177 of the drain electrode 175 functions as a light blocking portion, so light leakage may be prevented.

Next, a plurality of color filters 230 are disposed on the data line 171. The color filters 230 may include a red color filter, a green color filter, and a blue color filter. Each color filter 230 may be disposed one by one in the regions defined by the intersection of a plurality of gate lines 121 and a plurality of data lines 171. However, according to an exemplary embodiment, an organic film may be disposed instead of the color filter 230.

Next, an insulating layer 180 is disposed. The insulating layer 180 may be made of an inorganic insulator such as a silicon nitride or a silicon oxide, an organic insulator, or a low dielectric constant insulating material. For example, the insulating layer 180 may be the organic layer and the thickness of the organic layer may be 2 μm to 3 μm. The insulating layer 180 can prevent the material of the color filter 230 from diffusing into the liquid crystal layer 3. However, the insulating layer 180 may be omitted according to an exemplary embodiment.

The insulating layer 180 and the color filter 230 include an opening 185 exposing the drain electrode 175. The first electrode 191 is physically and electrically connected to the drain electrode 175 through the opening 185, thereby receiving the data voltage from the drain electrode 175.

The first electrode 191 may include a transparent conductor such as ITO or IZO.

The first electrode 191 may include a stem portion 192 extending along the second direction and a minute branch portion 193 extending from the stem portion. The edge of the minute branch portion 193 may be connected by an outer portion 194. The first electrode 191 includes a protruded portion 195 overlapping the extension 177 of the drain electrode 175, and may be connected to the extension 177 of the drain electrode 175 in the protruded portion 195.

The first electrode 191 may further include a shielding portion 196 extending parallel to the first direction DR1. The shielding portion 196 may be disposed between the storage electrode line 131 and the gate line 121, and may be connected to the protruded portion 195. The shielding portion 196 may be omitted according to an exemplary embodiment.

A part of the minute branch portion 193 of the first electrode 191 may not be connected to the outer portion 194. Also, the protruded portion 195 and the stem portion 192 of the first electrode 191 may be separated from each other. This is a structure for improving the alignment of the liquid crystal at the edge of the first electrode 191.

The first electrode 191 may be a pixel electrode and may receive a pixel voltage from the drain electrode.

A spacer 310 is disposed on the first electrode 191. The spacer 310 may be disposed while filling the recessed space due to the opening 185 formed in the color filter 230 and the insulating layer 180. Therefore, in the region near the opening 185, it is possible to prevent the misalignment of the liquid crystal from being caused by the step due to opening 185.

Figure 4:
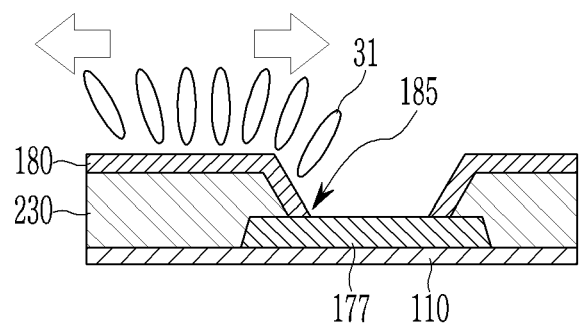
FIG. 4 is a view simplifying an alignment of a liquid crystal molecule when a spacer does not fill an opening.
Figure 5:
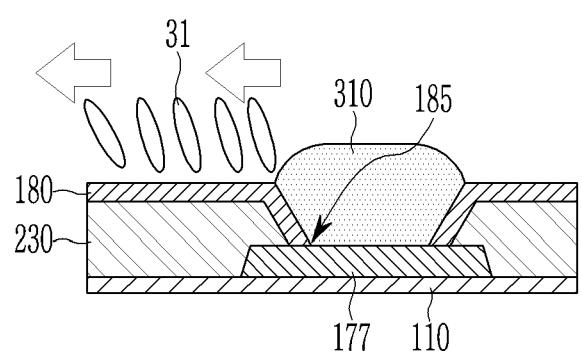
FIG. 5 is a view showing an alignment of a liquid crystal molecule when a spacer fills an opening according to the present exemplary embodiment.
Figure 6:
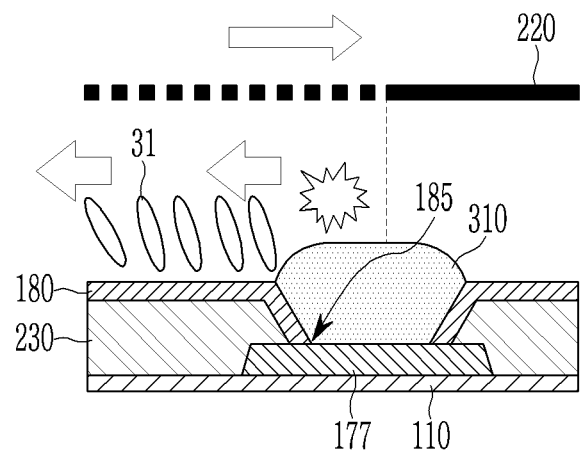
FIG. 6 is a view showing a principle of light leakage when a misalignment of upper and lower substrates occurs.

FIG. 4 is a view simplifying the alignment of liquid crystal molecules 31 when the spacer 310 does not fill the opening 185. In FIGS. 4 to 6, for better comprehension and ease of description, some constituent elements are only briefly shown.

Referring to FIG. 4, the alignment direction of the liquid crystal molecule 31 changes by a slanted portion of the opening 185. In FIG. 4, the change of the alignment direction may be represented by an arrow.

FIG. 5 shows the alignment of the liquid crystal molecule 31 when the spacer 310 fills the opening 185 according to the present exemplary embodiment. As shown in FIG. 5, when the spacer 310 fills the empty space of the opening 185, in particular, the slanted portion of the opening 185, the liquid crystal molecules 31 may be aligned evenly throughout. That is, in the present exemplary embodiment, it may be confirmed that the liquid crystal molecules 31 are aligned in the same direction.

FIG. 6 is a view showing a principle of light leakage when a misalignment of upper and lower substrates occurs. In FIG. 6, the opening of the light blocking layer 220 is represented by a dotted line. As shown in FIG. 6, when the position of the opening of the light blocking layer 220 is displaced by the misalignment between the lower panel and the upper panel, as shown in FIG. 6, the spacer 310 may be exposed. However, the spacer 310 cannot block light with the organic material, so light leakage occurs in the region exposed.

However, referring to FIG. 1 to FIG. 3, in the display device according to the present exemplary embodiment, the extension 177 of the drain electrode 175 is elongated in the first direction DR1. Therefore, even when the misalignment between the upper substrate and the lower substrate misalignment occurs, light leakage may be blocked by the extension 177 of the drain electrode 175, so light leakage may be effectively prevented. That is, as confirmed in FIG. 1 and FIG. 2, the one edge of the extension 177 of the drain electrode 175 in the first direction may be disposed closer to the one edge the light blocking layer 220 than one edge of the spacer 310 dispose adjacent to the one edge of the extension 177 of the drain electrode 175 and the one edge of the light blocking layer 220, and even when the misalignment between the upper substrate and the lower substrate occurs, the light is blocked by the extension 177 of the drain electrode 175, thereby preventing light leakage.

Referring to FIG. 1, the width of the spacer 310 in the first direction DR1 may be similar to the width of the first electrode 191 in the first direction DR1. In this specification, the word similar means that the difference is 20% or less.

Since the width of the spacer 310 in the first direction DR1 and the width of the first electrode 191 in the first direction DR1 are similar, the misalignment of most liquid crystal molecules 31 aligned on the first electrode 191 may be prevented. That is, the spacer 310 prevents the liquid crystal molecules 31 from being arranged in opposite directions, and may increase the display quality of the display device.

Next, the second display panel 200 is described with reference to FIG. 1 to FIG. 3. The second display panel 200 includes the light blocking layer 220 disposed on a second substrate 210 made of transparent glass or plastic. The light blocking layer 220 has an opening in the region overlapping the first electrode 191 of the first display panel 100. According to FIG. 1, the light blocking layer 220 is disposed to overlap the data line 171, the gate line 121, and so on, and does not overlap most of the first electrode 191.

Referring to FIG. 1, a distance t2 between one edge of the light blocking layer 220 disposed adjacent to one edge of the first electrode and extending parallel to the first direction DR1, and one edge of the spacer 310 parallel to the first direction DR1 may be 5 μm to 10 μm.

Next, an overcoat 250 is disposed on the light blocking layer 220. The overcoat 250 may be omitted according to an exemplary embodiment. Next, a second electrode 270 is disposed on the overcoat 250. The second electrode 270 may be a common electrode, and may receive a common voltage.

The liquid crystal layer 3 includes the liquid crystal molecules 31. The liquid crystal molecules 31 of the liquid crystal layer 3 are aligned by the voltage between the first electrode 191 and the second electrode 270, thereby displaying the image.

As above-described, in the display device according to the present exemplary embodiment, the extension 177 of the drain electrode 175 is disposed to extend parallel to the first direction DR1, and one edge of the extension 177 of the drain electrode 175 extending parallel to the first direction DR1 is disposed close to one edge of the light blocking layer 220 extending parallel to the first direction DR1. Therefore, even if the position of the opening of the light blocking layer 220 is changed by the misalignment between the upper substrate and the lower substrate, light is blocked by the extension 177 of the drain electrode and light leakage may be prevented.

Figure 7:
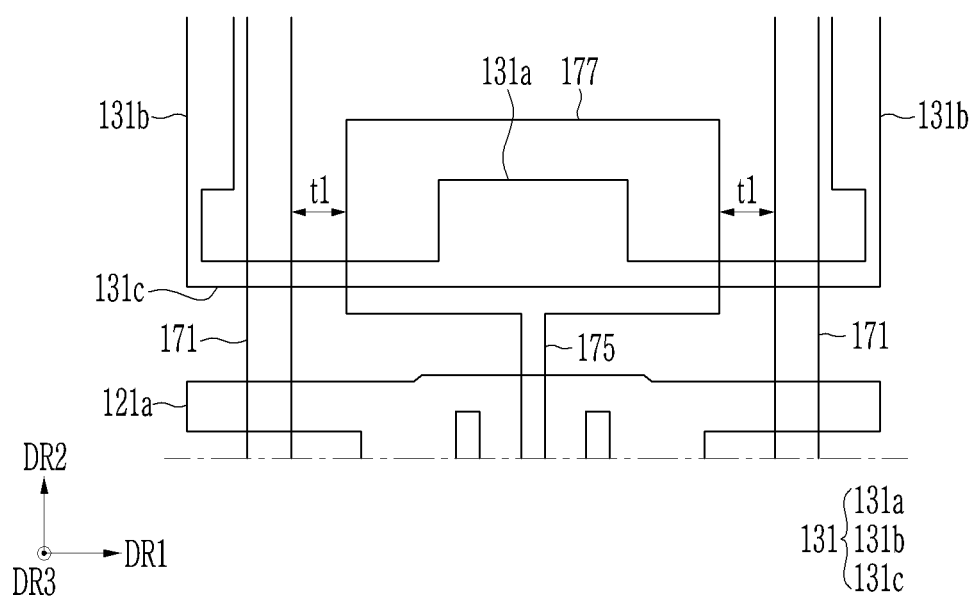
FIG. 7 is a view illustrating only a partial configuration of a storage electrode line and a drain electrode in a display device according to the exemplary embodiment.

FIG. 7 shows some configurations of the storage electrode line 131 and the drain electrode 175 in the display device according to the exemplary embodiment of FIG. 1. As shown in FIG. 7, the extension 177 of the drain electrode 175 is disposed to be extended in the first direction DR1, and the separation distance t1 of the extension 177 of the drain electrode 175 and the data line 171 in the first direction DR1 may be 1 μm to 10 μm. In this way, the storage electrode line 131 positioned in the region where the extension 177 of the drain electrode 175 and the data line 171 are separated may be cut to be repaired. Referring to FIG. 7, in the display device according to the present exemplary embodiment, the protruded portion 131a of the storage electrode line 131 is completely covered by the extension 177 of the drain electrode 175. That is, the planar area of the protruded portion 131a of the storage electrode line 131 is smaller than the planar area of the extension 177 of the drain electrode 175. Accordingly, in the manufacturing process, even if the position of the storage electrode line 131 and the position of the protruded portion 131a change a little, since they are still covered by the extension 177 of the drain electrode 175, the area where the extension 177 of the drain electrode 175 and the protruded portion 131a of the storage electrode line 131 overlap in the third direction DR3 remains the same. The overlapping region of the extension 177 of the drain electrode 175 and the protruded portion 131a of the storage electrode line 131 functions as a capacitor, thereby uniformly maintaining the capacitance of the capacitor.

Figure 8:
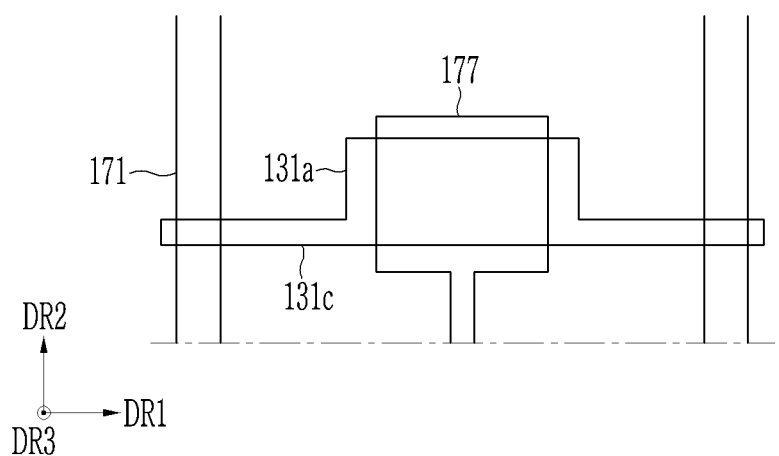
FIG. 8 is a view showing the same region as that of FIG. 7 according to another exemplary embodiment.

FIG. 8 shows the same region as that of FIG. 7 according to another exemplary embodiment. Referring to FIG. 8, in the case of the present exemplary embodiment, the protruded portion 131a of the storage electrode line 131 is not completely covered by the extension 177 of the drain electrode 175 in a plan view. In this case, the overlapping area of the protruded portion 131a of the storage electrode line 131 and the extension 177 of the drain electrode 175 may be changed by the alignment error during the forming of the storage electrode line 131 or the alignment error during the forming of the drain electrode 175. In this case, since the capacitance of the display device is changed, the reliability of the display device may be reduced. Also, in the case of the exemplary embodiment of FIG. 8, since the extension 177 of the drain electrode 175 is not elongated enough to prevent light leakage along the first direction DR1, light leakage may occur in the region between the drain electrode 175 and the data line 171.

However, again referring to FIG. 7, in the display device according to the present exemplary embodiment, the protruded portion 131a of the storage electrode line 131 is disposed to be completely covered by the extension 177 of the drain electrode 175, and the extension 177 of the drain electrode 175 is elongated enough to prevent light leakage along the first direction DR1. Therefore, even if the misalignment between the upper substrate and the lower substrate misalignment occurs, light leakage may be prevented, and even if the misalignment occurs during the formation of the storage electrode line 131 or the drain electrode 175, the capacitance of the display device may be kept the same.

Figure 9:
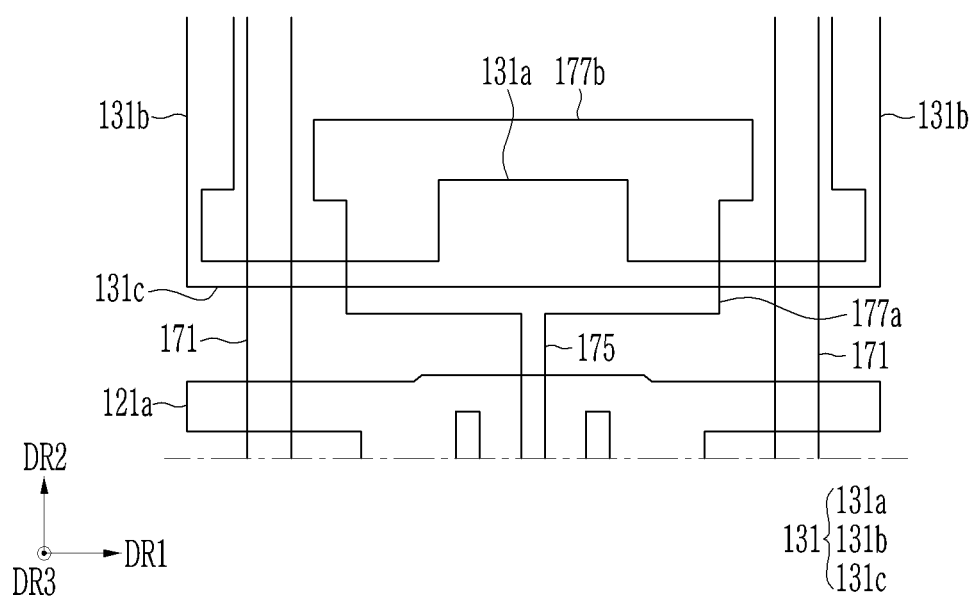
FIG. 9 and FIG. 10 are views showing the same region as that of FIG. 7 according to another exemplary embodiment of the present inventive concept.
Figure 10:
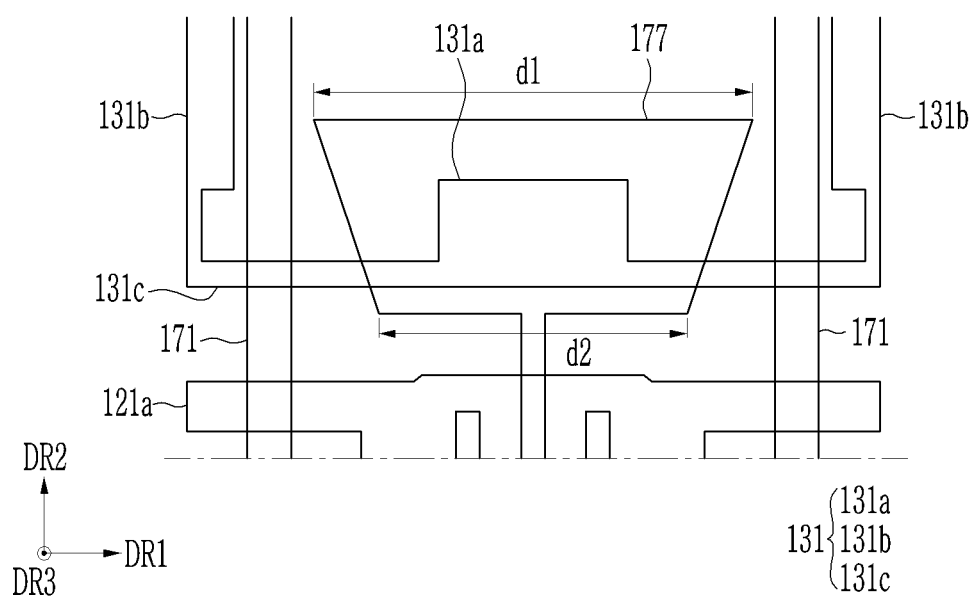

Next, the display device according to another exemplary embodiment of the present inventive concept is described. FIG. 9 and FIG. 10 are views showing the same region as that of FIG. 7 according to another exemplary embodiment of the present inventive concept.

Referring to FIG. 9, the display device according to the present exemplary embodiment is the same as the display device according to the exemplary embodiment of FIG. 7, except for a point that the extension 177 of the drain electrode 175 includes a second region 177b having a longer length in the first direction DR1 and a first region 177a having a shorter length in the first direction DR1. The detailed description for the same constituent element is omitted.

Referring to FIG. 9, the extension 177 of the drain electrode 175 of the display device according to the present exemplary embodiment includes the first region 177a and the second region 177b having the different lengths in the first direction DR1. The length of the second region 177b in the first direction DR1 is longer than that of the first region 177a, and the second region 177b is disposed closer to an opening (not shown) of the light blocking layer than the first region 177a.

That is, the region adjacent to the opening of the light blocking layer where light leakage is likely to occur may have an increased length in the first direction DR1 to block light leakage, and the overlapping region with the storage electrode line 131 where the repair space should be secured may be have a shortened length in the first direction DR1 to secure the repair space. In this case, while the sufficient repair space is secured by the first region 177a, light leakage can be effectively prevented by the second region 177b.

FIG. 10 is a view showing the same region as that of FIG. 7 according to another exemplary embodiment of the present inventive concept.

Referring to FIG. 10, the display device according to the present exemplary embodiment is the same as the display device according to the exemplary embodiment of FIG. 7 except for a point that the length of the extension 177 of the drain electrode 175 in the first direction DR1 is different on the upper surface and the lower surface. The detailed description of the same constituent element is omitted.

Referring to FIG. 10, the length d1 of the side adjacent to the opening (not shown) of the light blocking layer among the extension 177 of the drain electrode 175 is longer than the length d2 of the other side. Therefore, the planar shape of the extension 177 of the drain electrode 175 may be a trapezoid as shown in FIG. 10.

Thus, since the length d1 of the side adjacent to the opening (not shown) of the light blocking layer is longer than the length d2 of the side close to the storage electrode line, the sufficient repair space may be secured while effectively preventing light leakage. That is, light leakage at the opening of the light blocking layer may be blocked by the long side with the length d1, and the sufficient distance between the extension 177 of the drain electrode 175 and the data line 171 is secured by the short side with the length d2, thereby securing the repair space.

While this inventive concept has been described in connection with what is presently considered to be practical exemplary embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
    a first substrate;
    a gate line disposed on the first substrate and extending parallel to a first direction;
    a storage electrode line disposed on the same layer as the gate line;
    a data line insulated from the gate line and the storage electrode line and extending parallel to a second direction perpendicular to the first direction;
    a drain electrode disposed on the same layer as the data line and including an expansion;
    a first electrode electrically connected to the drain electrode;
    a spacer disposed on the first electrode;
    a second substrate overlapping the first substrate; and
    a light blocking layer disposed on the second substrate and having an opening exposing the first electrode,
    wherein the storage electrode line includes a transverse portion disposed parallel to the first direction and an expansion protruded from the transverse portion along the second direction, and
    wherein a planar area of the expansion of the storage electrode line is smaller than a planar area of the expansion of the drain electrode.

2. The display device of claim 1, wherein a length of the expansion of the drain electrode along the first direction is longer than a length along the second direction.

3. The display device of claim 1, wherein the expansion of the storage electrode line is completely covered by the expansion of the drain electrode.

4. The display device of claim 1, wherein a length of the spacer along the first direction is longer than a length of the expansion of the drain electrode along the first direction.

5. The display device of claim 1, wherein a difference of the width of the first electrode along the first direction and the width of the spacer along the first direction is 20% or less.

6. The display device of claim 1, wherein a distance between one edge of the light blocking layer extending parallel to the first direction and one edge of the spacer extending parallel to the first direction is 5 µm to 10 µm.

7. The display device of claim 1, wherein a distance between one edge of the light blocking layer extending parallel to the first direction and one edge of the expansion of the drain electrode extending parallel to the first direction is 10 µm or less.

8. The display device of claim 1, wherein one edge of the expansion of the drain electrode extending parallel to the first direction is disposed closer to the opening of the light blocking layer than one edge of the spacer extending along the first direction.

9. The display device of claim 1, further comprising a color filter disposed between the drain electrode and the first electrode, the color filter includes an opening overlapping the drain electrode, and the spacer is disposed to overlap the opening in a plan view.

10. The display device of claim 1, wherein the first electrode includes:
    a stem portion extending parallel to the second direction;
    a minute branch portion extending from the stem portion; and
    a protruded portion connected to the drain electrode, and
    wherein the protruded portion and the stem portion are spaced apart each other.

11. The display device of claim 1, wherein the gate line includes a first gate line and a second gate line extending parallel to the first direction, and a gate electrode connecting the first gate line and the second gate line, and the spacer overlaps the gate electrode in a plan view.

12. A display device comprising:
    a first substrate;
    a gate line disposed on the first substrate and extending parallel to the first direction;
    a storage electrode line disposed on the same layer as the gate line;
    a data line insulated from the gate line and the storage electrode line and extending parallel to second direction perpendicular to the first direction;
    a drain electrode disposed on the same layer as the data line and including an expansion;
    a first electrode electrically connected to the drain electrode;
    a spacer disposed on the first electrode;
    a second substrate overlapping the first substrate; and
    a light blocking layer disposed on the second substrate and having an opening exposing the first electrode,
    wherein the expansion of the drain electrode includes a first region and a second region, a length of the first region along the first direction is shorter than a length of the second region along the first direction, and the second region is closer to the opening of the light blocking layer than the first region,
    wherein the storage electrode line includes a transverse portion extending parallel to the first direction and an expansion protruded from the transverse portion along the second direction, and
    wherein the entire expansion of the storage electrode line is covered by the expansion of the drain electrode.

13. The display device of claim 12, wherein a length of the spacer along the first direction is longer than a length of the expansion of the drain electrode along the first direction.

14. The display device of claim 12, wherein the transverse portion of the storage electrode line overlaps the first region of the expansion of the drain electrode in a plan view.

* * * * *